United States Patent
Tsai et al.

(10) Patent No.: US 10,083,913 B2
(45) Date of Patent: Sep. 25, 2018

(54) FAN-OUT POP STRUCTURE WITH INCONSECUTIVE POLYMER LAYER

(71) Applicant: Taiwan Semiconductor Manufacturing Company, Ltd., Hsin-Chu (TW)

(72) Inventors: Yi-Lin Tsai, Tainan (TW); Jeffrey Chang, Hsin-Chu (TW); Jing-Cheng Lin, Hsin-Chu (TW); Nai-Wei Liu, Fengshan (TW); Tsei-Chung Fu, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/284,003

(22) Filed: Oct. 3, 2016

(65) Prior Publication Data
US 2017/0025359 A1   Jan. 26, 2017

Related U.S. Application Data

(62) Division of application No. 14/690,061, filed on Apr. 17, 2015, now Pat. No. 9,461,018.

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC . H01L 24/16; H01L 23/5389; H01L 25/0657; H01L 24/81; H01L 21/486; H01L 23/481; H01L 2924/181; H01L 23/3128; H01L 23/49811; H01L 25/105; H01L 25/50; H01L 2225/1035; H01L 23/49827; H01L 2224/48091; H01L 2224/12105; H01L 2224/32225; H01L 21/565; H01L 2924/15311; H01L 2225/1058; H01L 2924/00014; H01L 23/5386; H01L 23/5384; H01L 2924/00

See application file for complete search history.

(56) References Cited

U.S. PATENT DOCUMENTS 8,334,582 B2   12/2012   Jeng et al.
8,361,842 B2   1/2013    Yu et al.
(Continued)

FOREIGN PATENT DOCUMENTS

| CN | 101615598 A | 12/2009 |
| TW | 200847351 A | 12/2008 |
| TW | 201436067 A | 9/2014 |

*Primary Examiner* — Jasmine Clark
(74) *Attorney, Agent, or Firm* — Slater Matsil, LLP

(57) ABSTRACT

A package includes a device die, a molding material molding at least a portion of the device die therein, and a through-via substantially penetrating through the molding material. The package further includes a dielectric layer contacting the through-via and the molding material, and a die attach film attached to a backside of the device die. The die attach film includes a portion extending in the dielectric layer.

20 Claims, 19 Drawing Sheets

(51) Int. Cl.
*H01L 25/00* (2006.01)
*H01L 25/10* (2006.01)
*H01L 21/56* (2006.01)
*H01L 21/48* (2006.01)
*H01L 21/78* (2006.01)
*H01L 25/065* (2006.01)
*H01L 21/683* (2006.01)
*H01L 23/00* (2006.01)
*H01L 23/498* (2006.01)

(52) U.S. Cl.
CPC ........ *H01L 21/4857* (2013.01); *H01L 21/565* (2013.01); *H01L 21/568* (2013.01); *H01L 21/6835* (2013.01); *H01L 21/6836* (2013.01); *H01L 21/78* (2013.01); *H01L 23/3114* (2013.01); *H01L 23/3128* (2013.01); *H01L 23/49811* (2013.01); *H01L 23/5383* (2013.01); *H01L 23/5384* (2013.01); *H01L 23/5386* (2013.01); *H01L 24/83* (2013.01); *H01L 25/0657* (2013.01); *H01L 25/105* (2013.01); *H01L 25/50* (2013.01); *H01L 24/32* (2013.01); *H01L 2221/68318* (2013.01); *H01L 2221/68345* (2013.01); *H01L 2221/68359* (2013.01); *H01L 2221/68381* (2013.01); *H01L 2224/04105* (2013.01); *H01L 2224/12105* (2013.01); *H01L 2224/32225* (2013.01); *H01L 2224/48091* (2013.01); *H01L 2224/48227* (2013.01); *H01L 2224/73265* (2013.01); *H01L 2224/8385* (2013.01); *H01L 2225/1035* (2013.01); *H01L 2225/1058* (2013.01); *H01L 2924/15311* (2013.01); *H01L 2924/18162* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2001/0038151 A1* | 11/2001 | Takahashi ........... H01L 23/3107 257/778 |
| 2008/0290496 A1 | 11/2008 | Park |
| 2011/0291288 A1 | 12/2011 | Wu et al. |
| 2012/0104562 A1 | 5/2012 | Pagaila et al. |
| 2013/0001776 A1 | 1/2013 | Yu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0077364 A1 | 3/2014 | Marimuthu et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0118333 A1* | 4/2016 | Lin ........................ H01L 24/97 257/773 |

\* cited by examiner

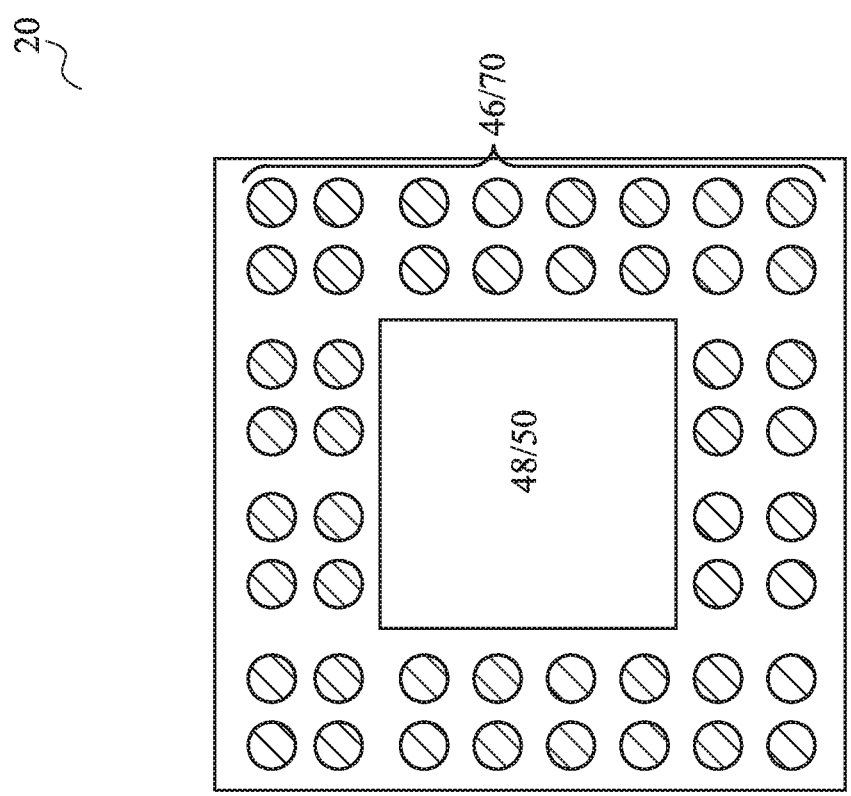

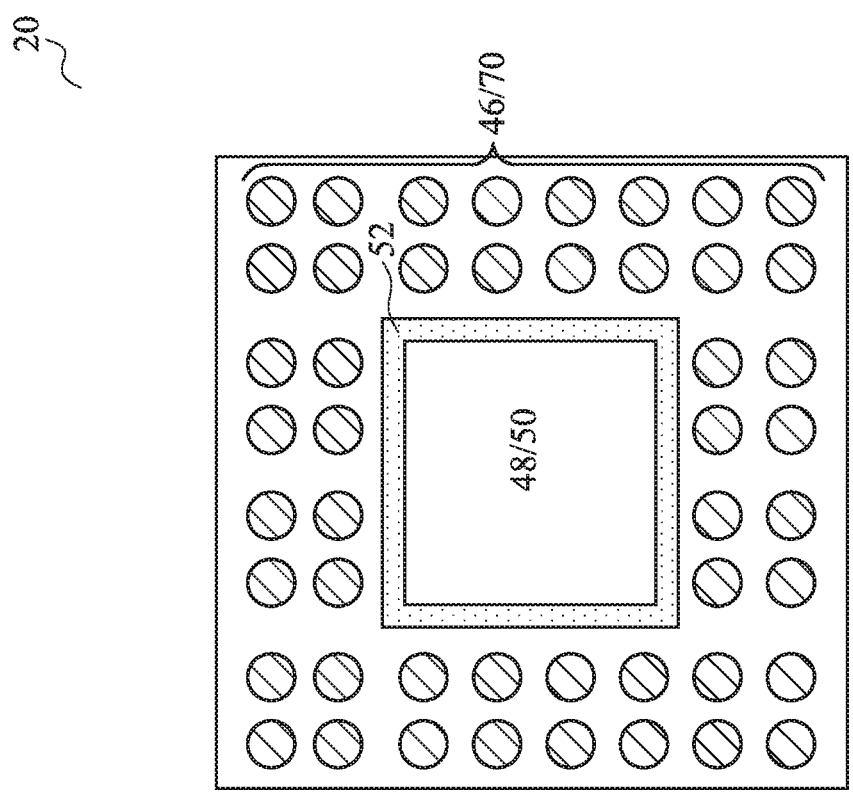

FAN-OUT POP STRUCTURE WITH INCONSECUTIVE POLYMER LAYER

PRIORITY CLAIM AND CROSS-REFERENCE

This application is a divisional of U.S. patent application Ser. No. 14/690,061, now U.S. Pat. No. 9,461,018, entitled "Fan-out POP Structure with Inconsecutive Polymer Layer," filed on Apr. 17, 2015, which application is incorporated herein by reference.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips and connect interior integrated circuits to exterior pins.

With the increasing demand for more functions, Package-on-Package (PoP) technology, in which two or more packages are bonded in order to expand the integration ability of the packages, was developed. With a high degree of integration, the electrical performance of the resulting PoP package can be improved benefiting from the shortened connecting paths between components. By using the PoP technology, package design becomes more flexible and less complex. Time-to-market is also reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 15A illustrate the cross-sectional views of intermediate stages in the formation of a fan-out Package-on-Package (PoP) package in accordance with some embodiments;

FIGS. 16A and 16B illustrate the top views of fan-out PoP packages in accordance with some embodiments.

DETAILED DESCRIPTION

Figure 1:
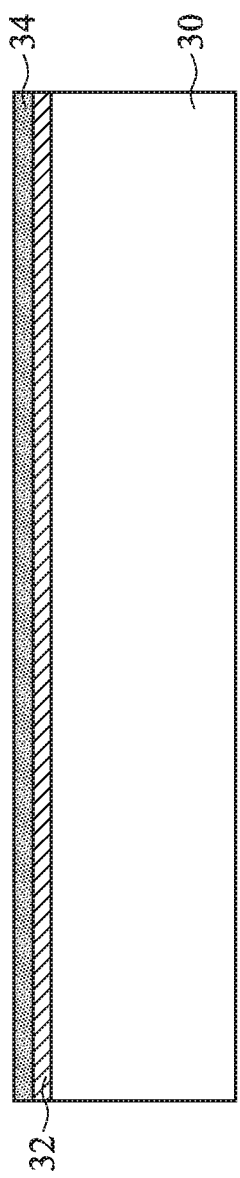

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 17:
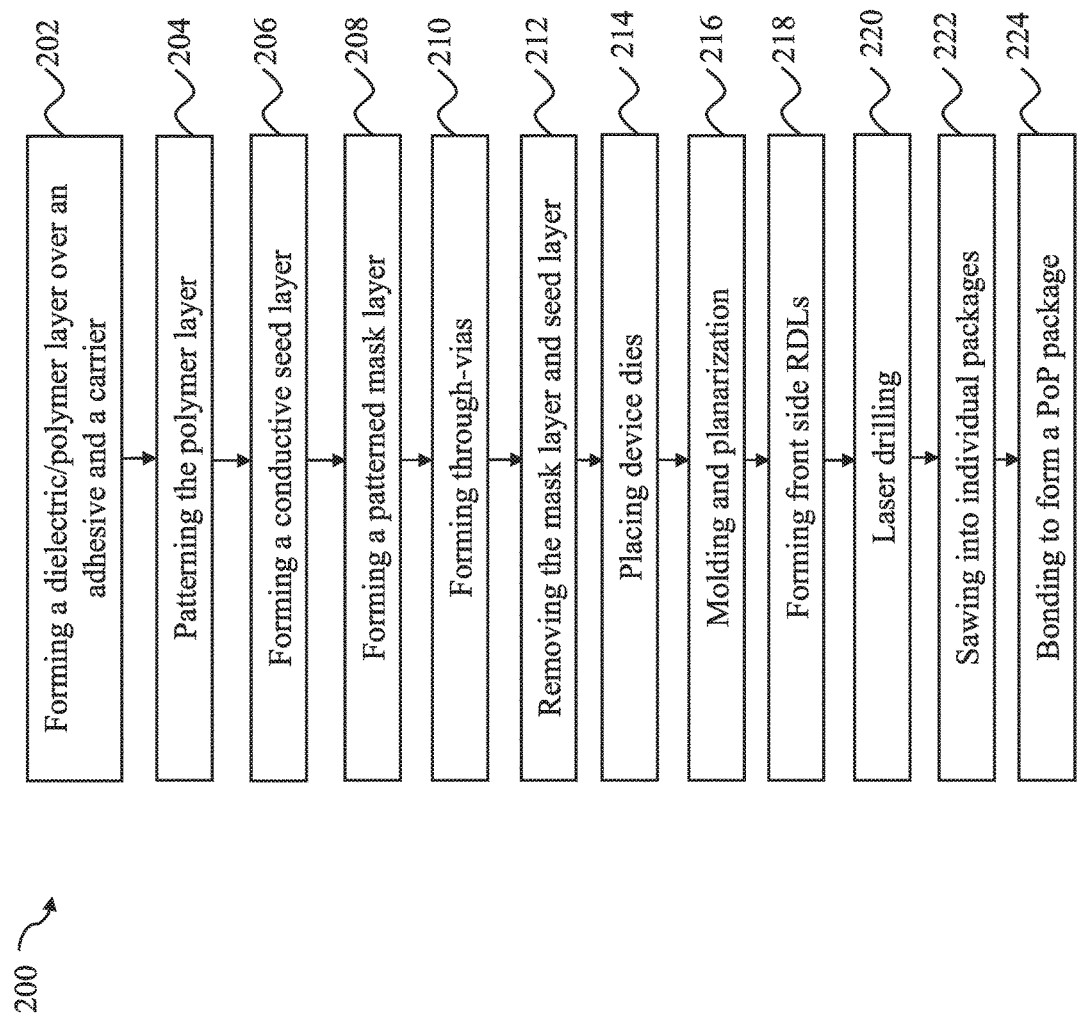
FIG. 17 illustrates a process flow for forming a PoP package in accordance with some embodiments.

A fan-out Package-on-Package (PoP) structure/package and the method of forming the package are provided in accordance with various exemplary embodiments. The variations of the embodiments are discussed. Throughout the various views and illustrative embodiments, like reference numbers are used to designate like elements. FIGS. 1 through 15A illustrate the cross-sectional views of intermediate stages in the formation a package in accordance with some embodiments. The steps shown in FIGS. 1 through 15B are also illustrated schematically in the process flow 200 shown in FIG. 17. In the subsequent discussion, the process steps shown in FIGS. 1 through 15A are discussed referring to the process steps in FIG. 17.

Referring to FIG. 1, carrier 30 is provided, and adhesive layer 32 is disposed over carrier 30. Carrier 30 may be a blank glass carrier, a blank ceramic carrier, or the like, and may have a shape of a semiconductor wafer with a round top-view shape. Carrier 30 is sometimes referred to as a carrier wafer. Adhesive layer 32 may be formed of a Light-to-Heat Conversion (LTHC) material, for example, although other types of adhesives may be used. In accordance with some embodiments of the present disclosure, adhesive layer 32 is capable of decomposing under the heat of light, and hence can release carrier 30 from the structure formed thereon.

Dielectric layer 34 is formed over adhesive layer 32. The respective step is shown as step 202 in the process flow shown in FIG. 17. In accordance with some embodiments of the present disclosure, dielectric layer 34 is a polymer layer formed of a polymer, which may be a photo-sensitive polymer such as polybenzoxazole (PBO), polyimide, or the like. In accordance with alternative embodiments, dielectric layer 34 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 2:
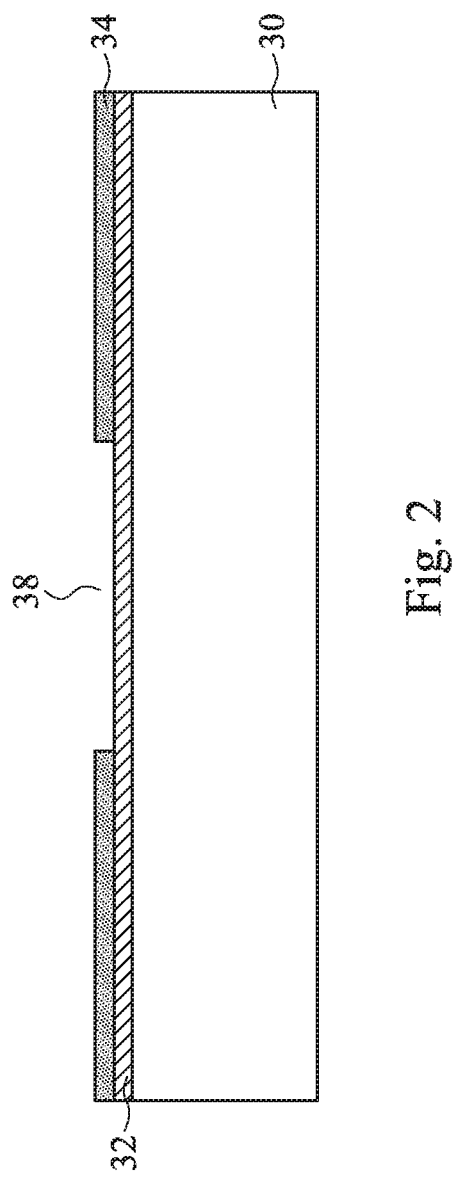

Referring to FIG. 2, dielectric layer 34 is patterned to form opening 38 therein. The respective step is shown as step 204 in the process flow shown in FIG. 17. Opening 38 is a through-opening. Hence, adhesive layer 32 is exposed through opening 38 in accordance with some embodiments of the present disclosure. It is appreciated that although FIG. 2 illustrates one opening 38, while there is a plurality of openings 38 formed in dielectric layer 34, each used for placing one or more device die. Furthermore, the openings 38 may be allocated as an array. In the embodiments in which dielectric layer 34 is formed of a photo-sensitive material, dielectric layer 34 may be patterned through light-exposure using a patterned photo lithography mask (not show), followed by developing dielectric layer 34. In accordance with alternative embodiments, the patterning of dielectric layer 34 includes applying a photo resist (not shown) over dielectric layer 34, patterning the photo resist, and then etching dielectric layer 34 using the photo resist as an etching mask.

Figure 3:
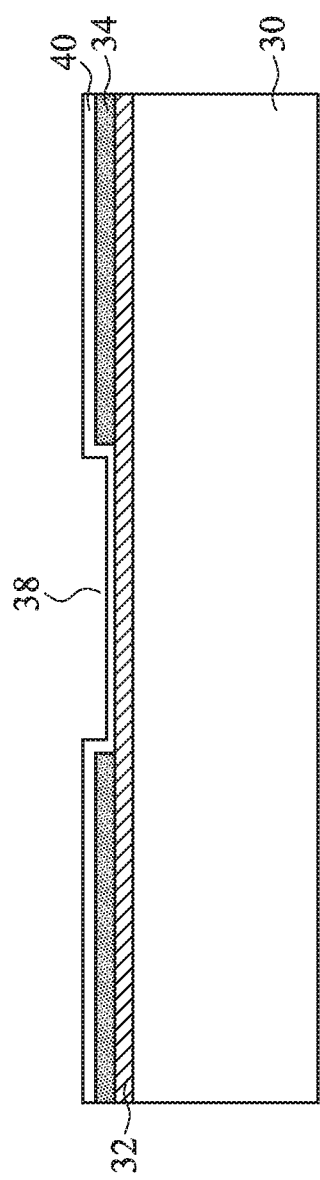

Referring to FIG. 3, conductive seed layer 40 is formed over dielectric layer 34, for example, through Physical Vapor Deposition (PVD). The respective step is shown as step 206 in the process flow shown in FIG. 17. Conductive seed layer 40 may be a metal seed layer including copper, aluminum, titanium, alloys thereof, or multi-layers thereof. In accordance with some embodiments of the present disclosure, conductive seed layer 40 includes a first metal layer such as a titanium layer (not shown) and a second metal layer such as a copper layer (not shown) over the first metal layer. In these embodiments, conductive seed layer 40 has a portion extending into opening 38, which the portion may be in contact with adhesive layer 32. In accordance with alternative embodiments of the present disclosure, conductive seed layer 40 includes a single metal layer such as a copper layer, which may be formed of substantially pure copper or a copper alloy.

Figure 4:
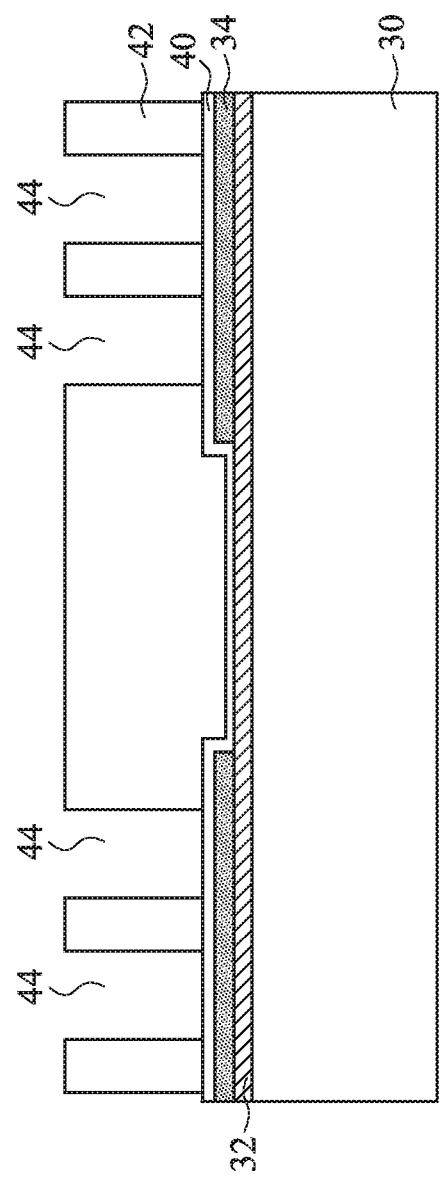

FIGS. 4 through 7 illustrate the formation of through-vias. As shown in FIG. 4, patterned mask layer 42 (such as a photo resist) is applied over conductive seed layer 40, and is then patterned using a photo lithography mask. The respective step is shown as step 208 in the process flow shown in FIG. 17. In accordance with some embodiments of the present disclosure, photo resist 42 is a dry film, which is laminated onto conductive seed layer 40. In accordance with alternative embodiments, photo resist 42 is formed by spin coating. As a result of the patterning (exposure and development), openings 44 are formed in photo resist 42, through which some portions of conductive seed layer 40 are exposed. The thickness of photo resist 42 is determined by the thickness of the subsequently placed device die 48 (FIG. 8). In accordance with some embodiments of the present disclosure, the thickness of photo resist 42 is greater than the thickness of device die 48.

Figure 5:
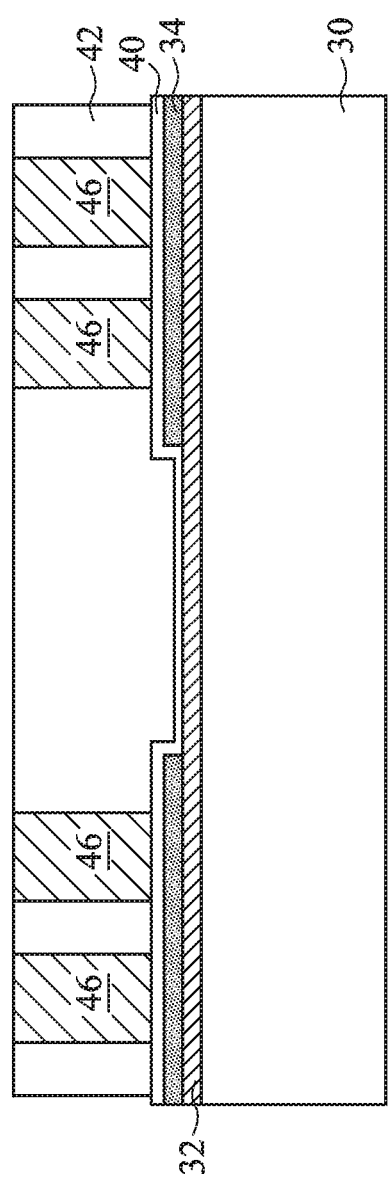

As shown in FIG. 5, through-vias 46 are formed in openings 44 through plating, which may be electro plating or electro-less plating. The respective step is shown as step 210 in the process flow shown in FIG. 17. Through-vias 46 are plated on the exposed portions of conductive seed layer 40. Through-vias 46 are conductive, and may be metal vias including copper, aluminum, tungsten, nickel, or alloys thereof. The top-view shapes of through-vias 46 include, and are not limited to, rectangles, squares, circles, and the like. The heights of through-vias 46 are determined by the thickness of the subsequently placed device die 48 (FIG. 8), with the heights of through-vias 46 slightly greater than or equal to the thickness of device die 48 in accordance with some embodiments of the present disclosure.

Figure 6:
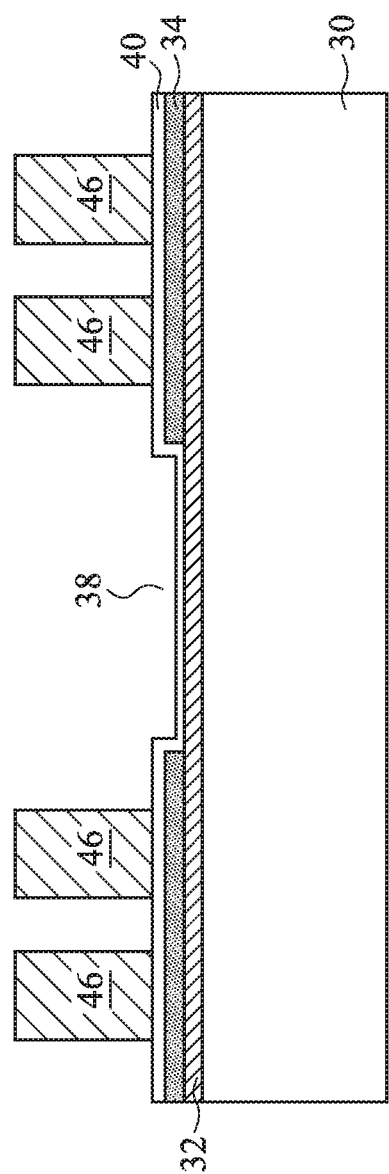

After the plating of through-vias 46, photo resist 42 is removed, and the resulting structure is shown in FIG. 6. The respective step is shown as step 212 in the process flow shown in FIG. 17. As a result, the portions of conductive seed layer 40 that are previously covered by photo resist 42 are exposed.

Figure 7:
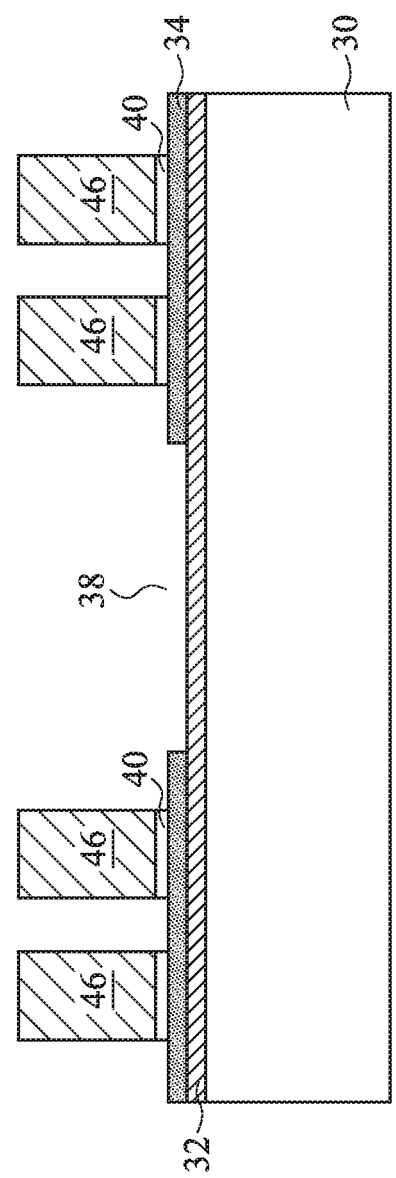
Figure 8:
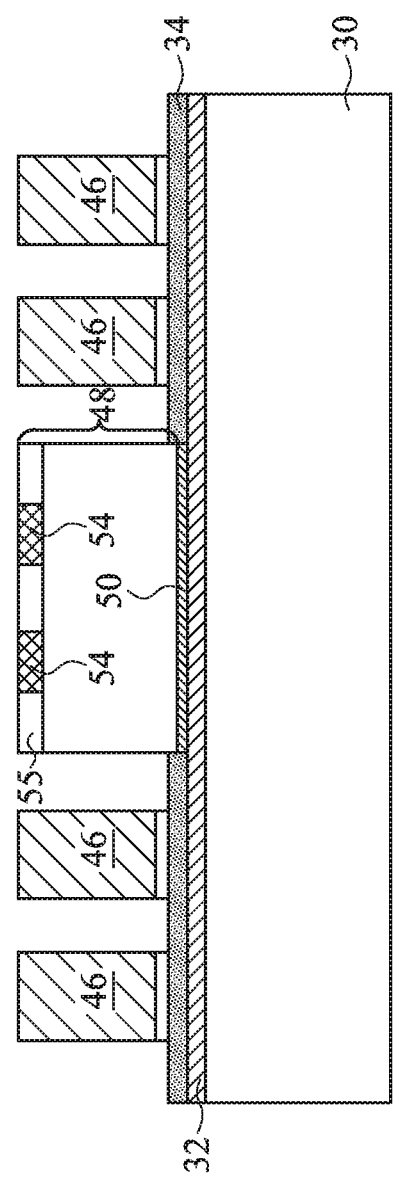

Next, as shown in FIG. 7, an etching step is performed to remove the exposed portions of conductive seed layer 40, wherein the etching may be an anisotropic or isotropic etching. The respective step is also shown as step 212 in the process flow shown in FIG. 17. The portions of conductive seed layer 40 that are overlapped by through-vias 46, on the other hand, remain not etched. Throughout the description, the remaining underlying portions of conductive seed layer 40 are referred to as the bottom portions of through-vias 46. Although conductive seed layer 40 is shown as having distinguishable interfaces with the overlying portions of through-vias 46, when conductive seed layer 40 is formed of a material similar to or the same as that of the respective overlying through-vias 46, conductive seed layer 40 may be merged with through-vias 46 with no distinguishable interface therebetween. For example, the copper layer in conductive seed layer 40 may be merged with through-vias 46 with no distinguishable interfaces. In accordance with alternative embodiments, there exist distinguishable interfaces between conductive seed layer 40 and the respective overlying plated portions of through-vias 46. For example, the titanium layer in conductive seed layer 40 may be distinguished from the copper-containing through-vias 46. As a result of the etching of conductive seed layer 40, dielectric layer 34 is exposed. In addition, opening 38 is revealed, and the layer underlying dielectric layer 34, (such as adhesive layer 32) is exposed through opening 38.

FIG. 8 illustrates the placement of device die 48 over adhesive layer 32. The respective step is shown as step 214 in the process flow shown in FIG. 17. Device die 48 may be adhered to adhesive layer 32 through die attach film 50. The edges of die attach film 50 are co-terminus with (aligned to) respective edges of the device die 48. Die attach film 50 is an adhesive film. Although FIG. 8 illustrates the placement of a single device die 48, a plurality of device dies identical to device die 48 may be placed over adhesive layer 32, with each device die being disposed corresponding to one of openings 38. Furthermore, each of openings 38 may have a single or more than one device die disposed. The plurality of placed device dies 48 may be arranged as an array including a plurality of rows and a plurality of columns. Device die 48 may include a semiconductor substrate having a back surface (the surface facing down) in physical contact with die attach film 50. Device die 48 further includes integrated circuit devices (such as active devices, which include transistors, for example, not shown) at the front surface (the surface facing up) of the semiconductor substrate. Device die 48 may include a logic die such as a Central Processing Unit (CPU) die, a Graphic Processing Unit (GPU) die, a mobile application die, or the like.

Device die 48 may include metal pillars 54 at its top surface. Metal pillars 54 are electrically coupled to the integrated circuits inside device die 48. In accordance with some exemplary embodiments of the present disclosure, as shown in FIG. 8, the top surfaces of metal pillars 54 are exposed. Metal pillars 54 may be copper pillars, and may also include other conductive/metallic materials such as aluminum, nickel, or the like. In accordance with some embodiments of the present disclosure, the top surfaces of metal pillars 54 are coplanar with the top surface of dielectric layer 55. In accordance with alternative embodiments of the present disclosure, metal pillars 54 are embedded in dielectric layer 55, with the top surface of dielectric layer 55 being higher than the top surfaces of metal pillars 54. Dielectric layer 55 may be formed of a polymer, which may include PBO, polyimide, or the like.

Figure 9:
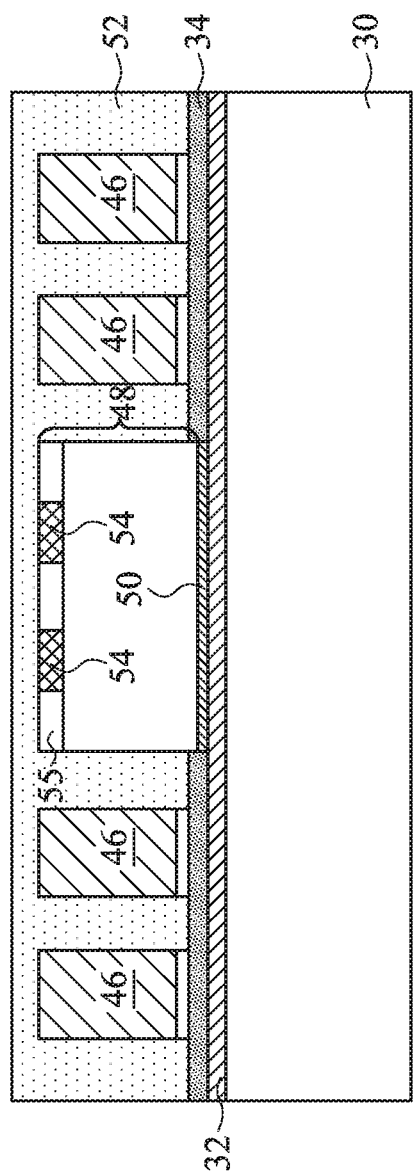

Also referring to FIG. 9, molding material (alternatively referred to as an encapsulating material) 52 is molded on device die 48 and through-vias 46. The respective step is shown as step 216 in the process flow shown in FIG. 17. Molding material 52 is dispensed as a fluid and is then cured, for example, in a thermal curing process. Molding material 52 fills the gaps between device die 48 and through-vias 46, and may be in contact with dielectric layer 34. Molding material 52 may include a molding compound, a molding underfill, an epoxy, or a resin. After the molding process, the top surface of molding material 52 is higher than the top ends of metal pillars 54 and through-vias 46.

Figure 10:
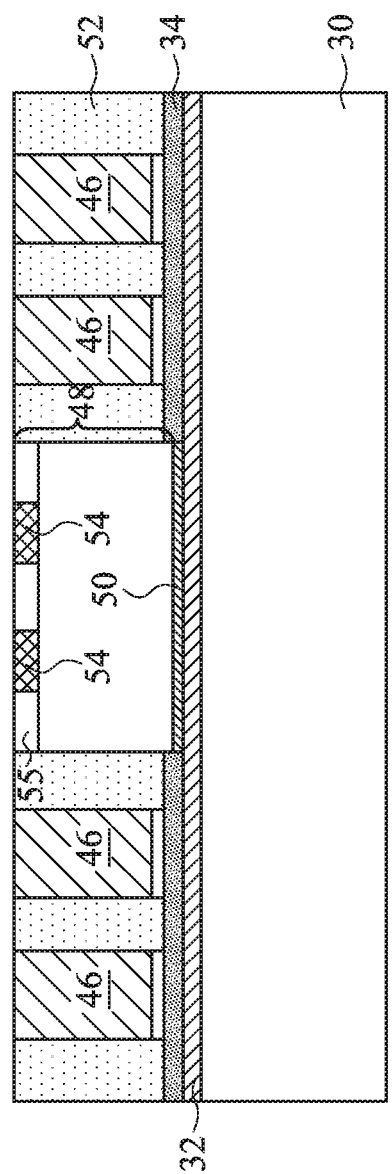

Next, a planarization step such as a Chemical Mechanical Polish (CMP) step or a grinding step is performed to planarize molding material 52, until through-vias 46 are exposed. The respective step is also shown as step 216 in the process flow shown in FIG. 17. The resulting structure is shown in FIG. 10. Metal pillars 54 of device die 48 are also exposed as a result of the planarization. Due to the planarization, the top surfaces of through-vias 46 are substantially level (coplanar) with the top surfaces of metal pillars 54, and are substantially level (coplanar) with the top surface of molding material 52.

Figure 11:
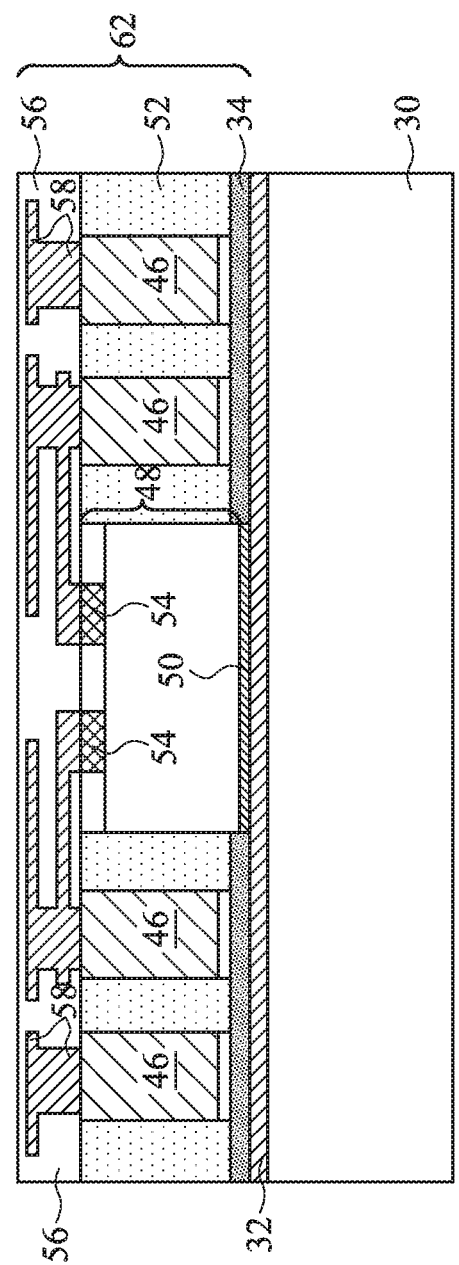

Referring to FIG. 11, one or more layers of dielectric layers 56 and the respective Redistribution Lines (RDLs) 58 are formed over molding material 52, through-vias 46, and metal pillars 54. The respective step is shown as step 218 in the process flow shown in FIG. 17. RDLs 58 are referred to as front side RDLs since they are on the front side of device die 48. In accordance with some embodiments of the present disclosure, dielectric layers 56 are formed of a polymer(s) such as PBO, polyimide, or the like. In accordance with alternative embodiments of the present disclosure, dielectric layers 56 are formed of an inorganic dielectric material(s) such as silicon nitride, silicon oxide, silicon oxynitride, or the like.

RDLs 58 are formed to electrically couple to metal pillars 54 and through-vias 46. RDLs 58 may also interconnect metal pillars 54 and through-vias 46 with each other. RDLs 58 may include metal traces (metal lines) and vias underlying and connected to the metal traces. In accordance with some embodiments of the present disclosure, RDLs 58 are formed through plating processes, wherein each of RDLs 58 includes a seed layer (not shown) and a plated metallic material over the seed layer. The seed layer and the plated metallic material may be formed of the same material or different materials.

Figure 12:
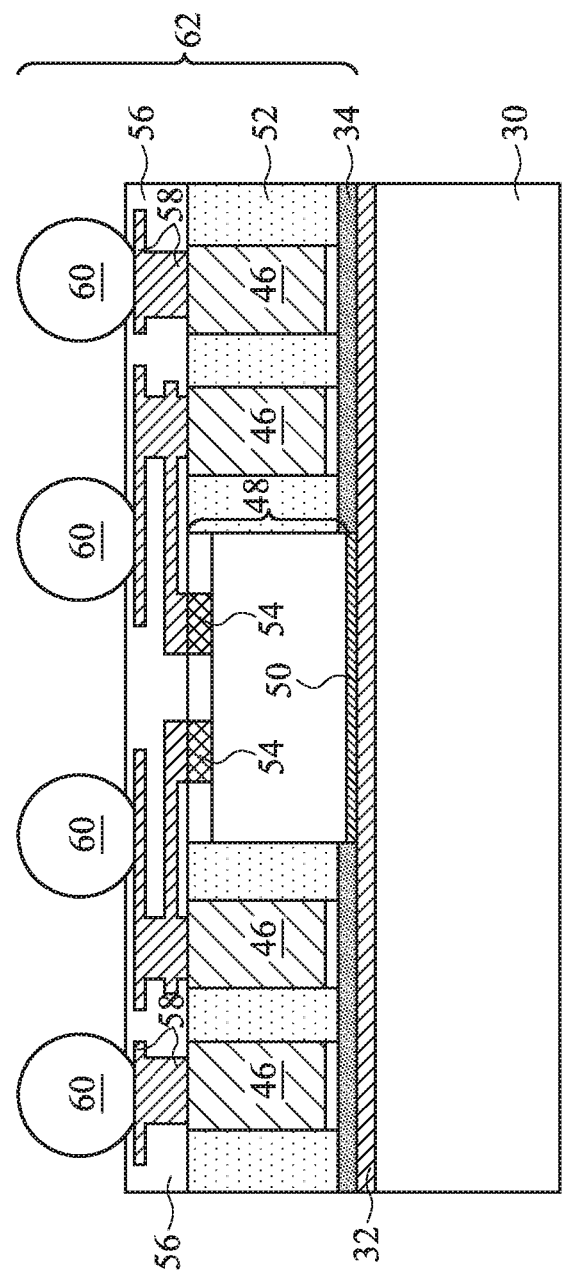

FIG. 12 illustrates the formation of electrical connectors 60 in accordance with some exemplary embodiments of the present disclosure. Electrical connectors 60 are electrically coupled to RDLs 58, metal pillars 54, and/or through-vias 46. The formation of electrical connectors 60 may include placing solder balls over RDLs 58 and then reflowing the solder balls. In accordance with alternative embodiments of the present disclosure, the formation of electrical connectors 60 includes performing a plating step to form solder regions over RDLs 58 and then reflowing the solder regions. Electrical connectors 60 may also include metal pillars, or metal pillars and solder caps, which may also be formed through plating. Throughout the description, the combined structure including device die 48, through-vias 46, molding material 52, RDLs 58, and dielectric layers 56 will be referred to as package 62, which may be a composite wafer including a plurality of device dies 48.

Next, a test may be performed to determine whether package 162 functions properly without defect. The test may be performed by probing electrical connectors 60 using a probe card (not shown). Through the test, the defective packages in package 162 is determined, so that after package 162 is sawed apart into individual packages, the defective individual packages are not used for forming PoP packages.

FIG. 12 illustrates two RDL layers 58. In accordance with alternative embodiments, there may be a single layer of RDLs 58 or more than two layers of RDLs 58, depending on the routing requirement of the respective package. In accordance with yet alternative embodiments of the present disclosure, there are no RDLs, and electrically connectors 60 are formed directly over through-vias 46 and metal pillars 54, with no RDLs formed between connectors 60 and the underlying through-vias 46 as well as metal pillars 54.

Figure 13:
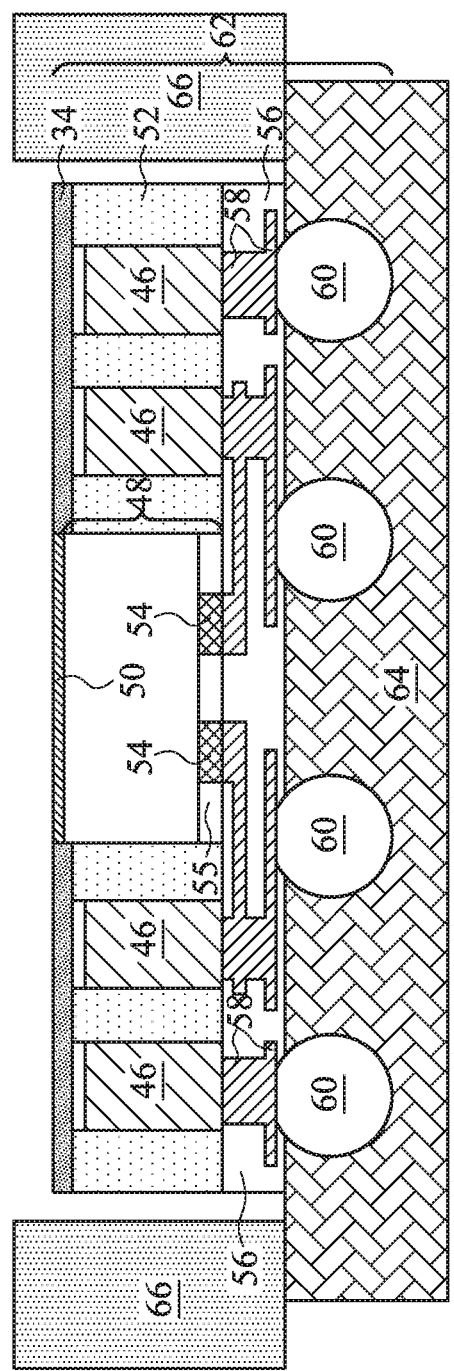

Next, package 62 is de-bonded from carrier 30. In accordance with some exemplary de-boding process, dicing tape 64 (FIG. 13) is attached to package 62 to protect electrical connectors 60, wherein dicing tape 64 is fixed to dicing frame 66. The de-bonding is performed, for example, by projecting a UV light or a laser on adhesive layer 32 (FIG. 12). For example, when adhesive layer 32 is formed of LTHC, the heat generated from the light or laser causes the LTHC to be decomposed, and hence carrier 30 is detached from package 62. The resulting structure is shown in FIG. 13.

Figure 14:
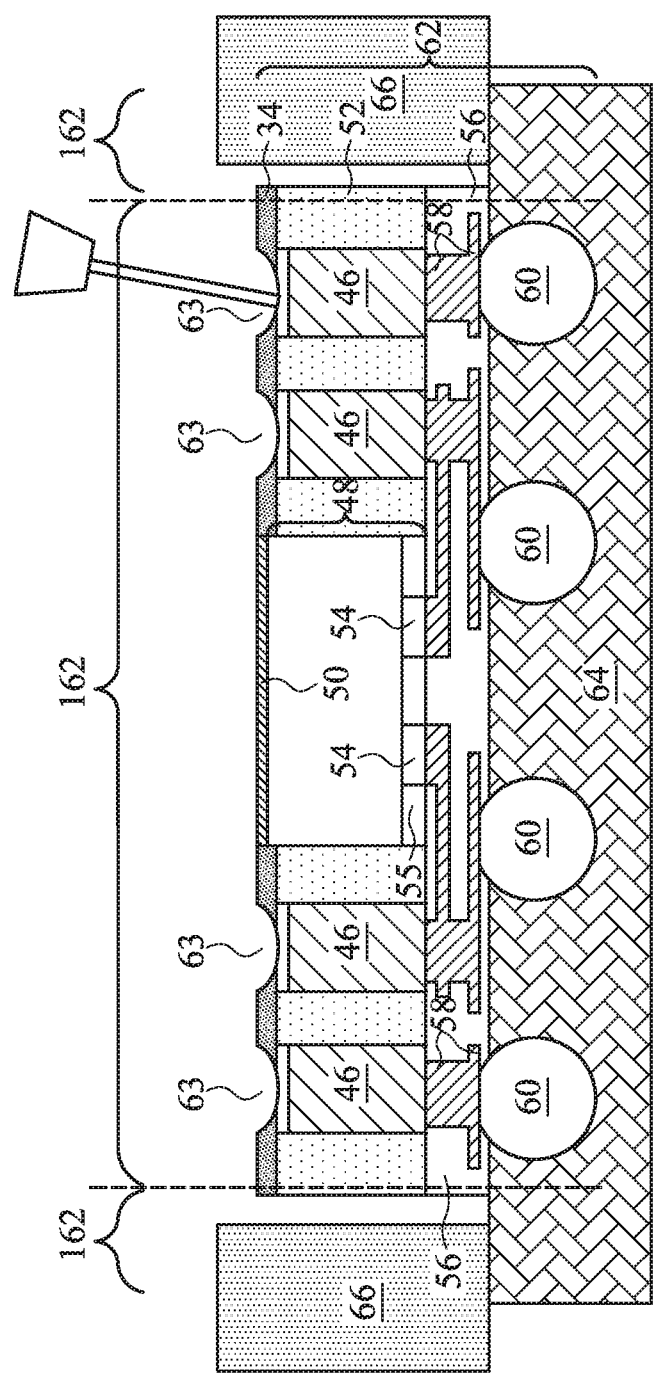

FIG. 14 illustrates the patterning for forming openings 63 in dielectric layer 34. The respective step is shown as step 220 in the process flow shown in FIG. 17. For example, when dielectric layer 34 is a polymer layer, it can be patterned using laser drill to remove the portions overlapping through-vias 46, so that through-vias 46 are exposed through openings 63.

In the embodiments in which a portion of conductive seed layer 40 is formed of titanium, the titanium layer of conductive seed layer 40 may also be removed. For example, Hydrogen Fluoride (HF) gas or a diluted HF solution may be used to etch titanium. The copper in conductive seed layer 40 is exposed, and hence the subsequently formed backside RDLs or electrical connectors such as solder regions may be formed thereon.

In accordance with some embodiments of the present disclosure, no solder regions are formed on the backside of package 62 at this time (before die saw). Furthermore, there are no backside RDLs formed. In accordance with alternative embodiments of the present disclosure, backside RDLs (not shown) and/or the electrical connectors are formed on the backside (the illustrated top side in FIG. 14) of device die 48, with the backside RDLs electrically coupled to through-vias 46. In accordance with some exemplary embodiments of the present disclosure, there is a single backside RDL layer. In accordance with alternative embodiments, there is a plurality of RDL layers, wherein vias are formed to interconnect the different metal traces in different RDL layers. The backside dielectric layers may also be formed of a polymer such as PBO, BCB, polyimide, or an inorganic material such as silicon oxide, silicon nitride, silicon oxynitride, or the like. Electrical connectors such as solder regions, metal pillars with solder caps, or the like may be formed.

In subsequent steps, package 62 is sawed apart into a plurality of packages 162, each including one of device dies 48 and the corresponding through-vias 46. The respective step is shown as step 222 in the process flow shown in FIG. 17. One of packages 162 is illustrated in FIG. 15A.

Figure 15A:
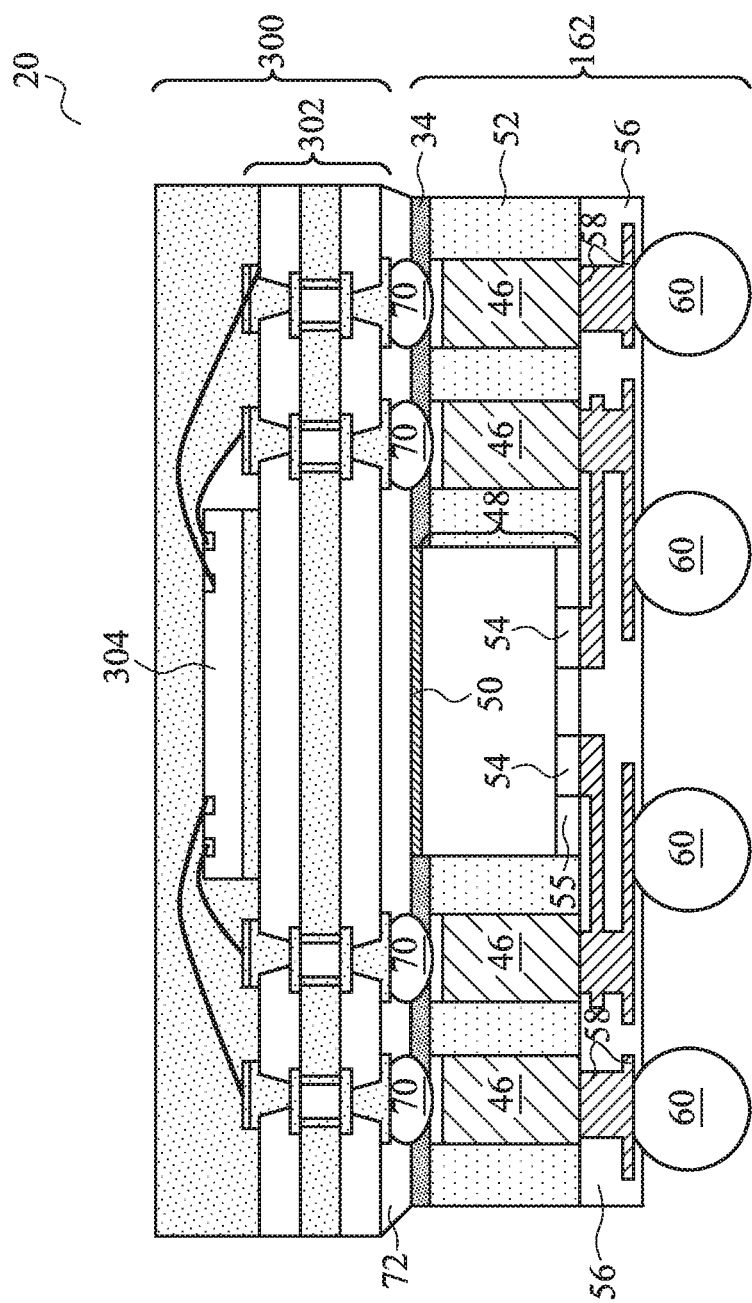

FIG. 15A illustrates the bonding of package 300 to package 162, thus forming PoP package 20. The respective step is shown as step 224 in the process flow shown in FIG. 17. Packages 300 and 162 are also referred to as a top package and a bottom package, respectively, of the PoP package 20. In the exemplary embodiments as shown in FIG. 15A, no backside RDL is illustrated, while the backside RDLs may be formed in accordance with alternative embodiments. The bonding is performed through solder regions 70, which join through-vias 46 to the metal pads in the overlying package 300. In some embodiments, package 300 includes device die(s) 304, which may be memory dies such as Static Random Access Memory (SRAM) dies, Dynamic Random Access Memory (DRAM) dies, or the like. The memory dies may also be bonded to package substrate 302 in some exemplary embodiments.

After the bonding of top package 300 to bottom package 162, underfill 72 is disposed into the gap between top package 300 and bottom package 162, and is then cured. The resulting underfill 72 is thus in contact with die attach film 50.

As shown in FIG. 15A, the top surface of dielectric layer 34 is coplanar with the top surface of die attach film 50. In accordance with some embodiments of the present disclosure, through-vias 46 have some portions of their top surfaces in contact with the bottom surface of dielectric layer 34. Die attach film 50 and device die 48 extend into dielectric layer 34, with the edges of dielectric layer 34 in physical contact with the edges of die attach film 50. These embodiments may be achieved by accurately designing the size of opening 38 (referring to FIGS. 7 and 8), so that die attach film 50 and device die 48 accurately fit into opening 38, with no extra space separating the edges of die attach film 50 and device die 48 from the respective edges of dielectric layer 34. The edges of dielectric layer 34 may also be in physical contact with the edges of device die 48 when die attach film 50 is thinner than dielectric layer 34.

Figure 15B:
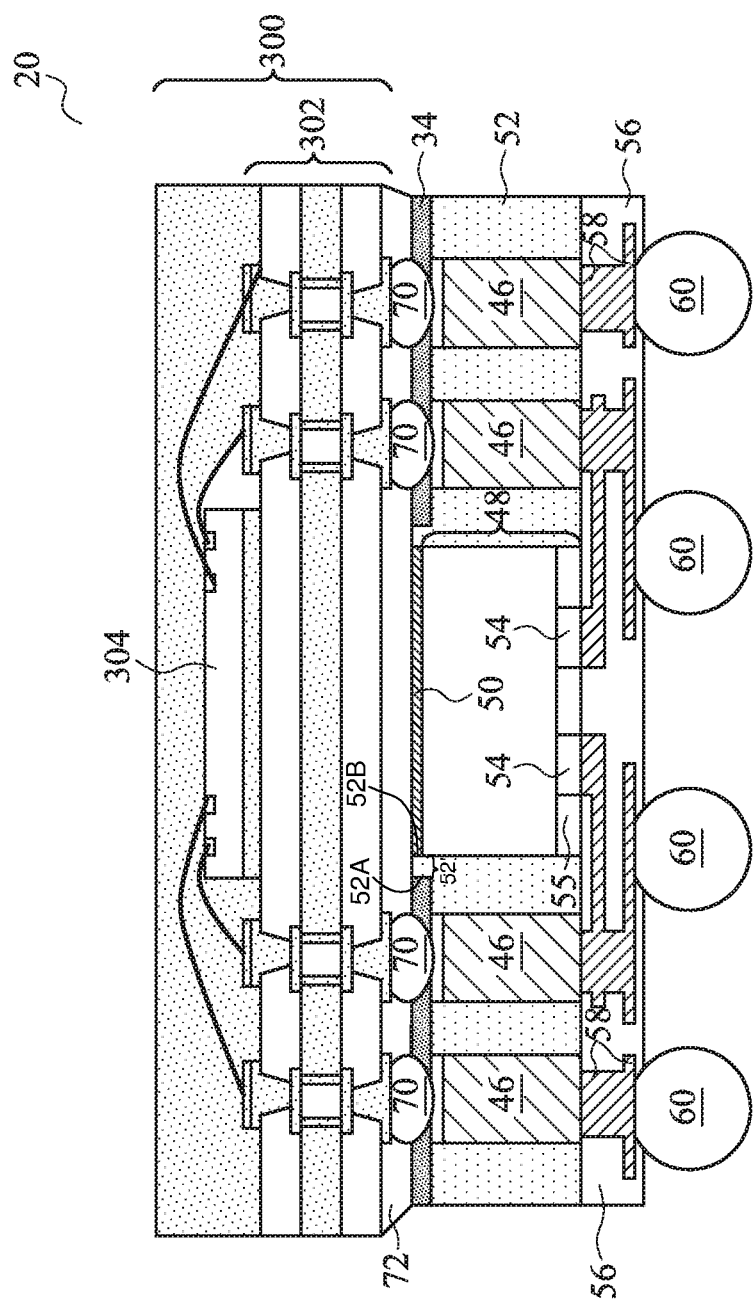
FIG. 15B illustrates a cross-sectional view of a fan-out PoP package in accordance with alternative embodiments.

In accordance with alternative embodiments of the present disclosure, the size of opening 38 (referring to FIG. 7) is greater than the size of die attach film 50 and device die 48, as shown in FIG. 15B. Accordingly, there are some spaces left to separate the edges of die attach film 50 and device die 48 from the respective edges of dielectric layer 34. As shown in FIG. 15B, underfill 72 may be in physical contact with the portions 52' of molding material 52 that extend into dielectric layer 34. As illustrated in FIG. 15B, molding material 52 includes portion 52' extending into dielectric layer 34. Molding material 52 (for example, referring to the portion including portion 52') has opposite sidewalls 52A and 52B, with sidewall 52A contacting a sidewall of dielectric layer 34, and sidewall 52B contacting a sidewall of die-attach film 50 and a sidewall of device die 48.

FIGS. 16A and 16B illustrate top views of some parts of PoP package 20 shown in FIGS. 15A and 15B, respectively. Referring to FIG. 16A, dielectric layer 34 encircles die attach film 50 and device die 48. Also, through-vias 46 and solder regions 70 are aligned to a ring encircling die attach film 50 and device die 48. The edges of die attach film 50 (and possibly the edges of device die 48) are in contact with the inner edges of dielectric layer 34, wherein the inner edges face the opening. Referring to FIG. 16B, dielectric layer 34 again encircles die attach film 50 and device die 48, with some spacing separating dielectric layer 34 from die attach film 50 and device die 48. Molding compound 52 fills the spacing. In accordance with some embodiments of the present disclosure, the spacing forms a ring encircling die attach film 50 and device die 48. In accordance with alternative embodiments of the present disclosure, one edge or two edges of die attach film 50 may be in contact with the respective inner edge(s) of dielectric layer 34, while other edges of die attach film 50 are spaced apart from the respective inner edge(s) of dielectric layer 34

The embodiments of the present disclosure have some advantageous features. By patterning the dielectric layer (polymer layer) over the adhesive layer, the polymer layer has a large opening inside it. This generates the discontinuity in the polymer layer, which reduces the stress caused by the polymer layer to the resulting PoP package. The warpage of the package may thus be reduced. In addition, the polymer layer is a relative soft material, and hence if a device die is placed on the polymer layer, due to the likely uneven pressure applied on different parts of the polymer, the thickness of the resulting polymer layer may be uneven, and hence the top surface of the resulting device die may not be parallel to the surfaces of the carrier, resulting process difficulty in subsequent processes. In the embodiments of the present disclosure, however, the device die is not placed on the polymer layer, and hence the above-discussed problems are eliminated. In addition, the opening in the polymer layer has the function of limiting the movement of the device die and the die attach film, so that the die shift is less likely to occur.

In accordance with some embodiments of the present disclosure, a package includes a device die, a molding material molding at least a portion of the device die therein, and a through-via substantially penetrating through the molding material. The package further includes a dielectric layer contacting the through-via and the molding material, and a die attach film attached to a backside of the device die. The die attach film includes a portion extending in the dielectric layer.

In accordance with alternative embodiments of the present disclosure, a package includes a polymer layer having a through-opening therein, a die attach film with at least a portion in the through-opening, a device die having a backside attached to the die attach film, and a molding compound. The device die is molded in the molding compound, and the polymer layer contacts the molding compound.

In accordance with alternative embodiments of the present disclosure, a method includes forming a polymer layer over a carrier, patterning the polymer layer to form a first opening, forming a through-via over the patterned polymer layer, and placing a device die, with at least a portion of a die attach film attached to the device die being in the first opening. The method further includes molding the device die and the through-via in a molding compound, forming redistribution lines electrically coupled to the device die and the through-via, removing the carrier from the polymer layer, and forming a second opening in the polymer layer to expose the through-via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
an encapsulating material;
a dielectric layer overlying the encapsulating material, wherein the encapsulating material comprises a first sidewall and a second sidewall opposite to each other, with a portion of the first sidewall contacting the dielectric layer;
a conductive post penetrating through the encapsulating material;
a device die; and
a die-attach film overlying and in contact with the device die, wherein edges of the die-attach film are vertically aligned to respective edges of the device die, and the die-attach film and the device die in combination penetrate through the encapsulating material, and wherein the second sidewall of the encapsulating material contacts the die-attach film and the device die.

2. The package of claim 1, wherein a top portion of the device die extends into the dielectric layer.

3. The package of claim 1, wherein a sidewall of the dielectric layer forms an interface with a sidewall of the die-attach film.

4. The package of claim 3, wherein the sidewall of the dielectric layer further forms an additional interface with a sidewall of the device die.

5. The package of claim 1, wherein the portion of the encapsulating material forms a ring encircling the die-attach film.

6. The package of claim 1 further comprising:
a package component overlying the device die and the encapsulating material;
a solder region penetrating through the dielectric layer, wherein the solder region bonds the package component to the conductive post; and
an underfill between the package component and the dielectric layer, wherein a bottom surface of the underfill forms an interface comprising:
a first portion formed between the underfill and the die-attach film; and
a second portion formed between the underfill and the dielectric layer, and the first portion and the second portion are coplanar with each other.

7. A package comprising:
an encapsulating material;
a dielectric layer extending from a top surface of the encapsulating material to an intermediate level of the encapsulating material, wherein the intermediate level is between the top surface and a bottom surface of the encapsulating material;
a die-attach film extending from the top surface of the encapsulating material into the encapsulating material;
a device die extending from the die-attach film to the bottom surface of the encapsulating material; and
a metal post extending from a bottom surface of the dielectric layer to the bottom surface of the encapsulating material.

8. The package of claim 7, wherein the die-attach film is spaced apart from the dielectric layer by a portion of the encapsulating material, and the portion of the encapsulating material encircles the die-attach film.

9. The package of claim 7, wherein a portion of the device die is at a same level as a portion of the dielectric layer.

10. The package of claim 7, wherein edges of the die-attach film are vertically aligned to respective edges of the device die.

11. The package of claim 7 further comprising redistribution lines underlying the encapsulating material, wherein the redistribution lines are electrically coupled to the device die and the metal post.

12. A package comprising:
a device die;
an encapsulating material encapsulating at least a portion of the device die therein;
a through-via substantially penetrating through the encapsulating material;
a dielectric layer contacting the through-via and the encapsulating material; and
a die-attach film attached to a backside of the device die, wherein the die-attach film comprises a portion extending into the dielectric layer.

13. The package of claim 12, wherein the dielectric layer comprises a through-opening, with the die-attach film extending into the through-opening.

14. The package of claim 13, wherein the dielectric layer comprises edges exposed to the through-opening, and wherein the die-attach film comprises edges contacting the edges of the dielectric layer.

15. The package of claim 13, wherein the dielectric layer comprises edges exposed to the through-opening, and wherein the die-attach film comprises edges separated from the edges of the dielectric layer by spacings, with the encapsulating material filling a portion of the through-opening.

16. The package of claim 12 further comprising a solder region extending into the dielectric layer to contact the through-via.

17. The package of claim 16 further comprising a top package bonded to the solder region.

18. The package of claim 12, wherein the dielectric layer comprises a polymer.

19. The package of claim 12, wherein the dielectric layer is further in contact with metal pillars in the device die.

20. The package of claim 1 further comprising an additional dielectric layer over the dielectric layer, wherein a bottom surface of the additional dielectric layer is in physical contact with the dielectric layer, the encapsulating material, and the die-attach film.

* * * * *